United States Patent

Tsai et al.

(10) Patent No.: US 8,822,336 B2
(45) Date of Patent: Sep. 2, 2014

(54) THROUGH-SILICON VIA FORMING METHOD

(75) Inventors: Teng-Chun Tsai, Tainan (TW); Chun-Yuan Wu, Yunlin County (TW); Chin-Fu Lin, Tainan (TW); Chih-Chien Liu, Taipei (TW); Chin-Cheng Chien, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 299 days.

(21) Appl. No.: 13/161,849

(22) Filed: Jun. 16, 2011

(65) Prior Publication Data

US 2012/0322260 A1 Dec. 20, 2012

(51) Int. Cl.
*H01L 21/283* (2006.01)

(52) U.S. Cl.
USPC .......................................................... 438/667

(58) Field of Classification Search
USPC .................................. 438/667; 257/E21.159
See application file for complete search history.

(56) References Cited

U.S. PATENT DOCUMENTS

| | | | |
|---|---|---|---|
| 3,648,131 A | 3/1972 | Stuby | |
| 4,394,712 A | 7/1983 | Anthony | |
| 4,395,302 A | 7/1983 | Courduvelis | |
| 4,525,733 A | 6/1985 | Losee | |
| 4,616,247 A | 10/1986 | Chang et al. | |
| 4,704,367 A | 11/1987 | Alvis | |
| 4,773,972 A | 9/1988 | Mikkor | |
| 4,939,568 A | 7/1990 | Kato et al. | |
| 4,992,152 A | 2/1991 | Mehra | |
| 5,040,048 A | 8/1991 | Yasue | |
| 5,214,000 A | 5/1993 | Chazan et al. | |
| 5,236,866 A | 8/1993 | Yasue | |
| 5,286,926 A | 2/1994 | Kimura et al. | |
| 5,372,969 A | 12/1994 | Moslehi | |
| 5,399,898 A | 3/1995 | Rostoker | |
| 5,439,731 A | 8/1995 | Li | |
| 5,463,246 A | 10/1995 | Matsunami | |
| 5,484,073 A | 1/1996 | Erickson | |
| 5,502,333 A | 3/1996 | Bertin et al. | |
| 5,518,805 A | 5/1996 | Ho | |
| 5,793,115 A | 8/1998 | Zavracky et al. | |
| 5,977,640 A | 11/1999 | Bertin et al. | |
| 6,037,197 A | 3/2000 | Yamazaki | |
| 6,080,657 A | 6/2000 | Liu | |
| 6,107,688 A | 8/2000 | Raina | |
| 6,140,701 A | 10/2000 | Raina | |
| 6,143,616 A | 11/2000 | Geusic et al. | |
| RE37,032 E | 1/2001 | Gardner | |

(Continued)

OTHER PUBLICATIONS

Internal UMC invention disclosure document, 7 pages, confidential document.

*Primary Examiner* — Charles Garber
*Assistant Examiner* — Stanetta Isaac
(74) *Attorney, Agent, or Firm* — Ding Yu Tan

(57) ABSTRACT

A through-silicon via forming method includes the following steps. Firstly, a semiconductor substrate is provided. Then, a through-silicon via conductor is formed in the semiconductor substrate, and a topside of the through-silicon via conductor is allowed to be at the same level as a surface of the semiconductor substrate. Afterwards, a portion of the through-silicon via conductor is removed, and the topside of the through-silicon via conductor is allowed to be at a level lower than the surface of the semiconductor substrate, so that a recess is formed over the through-silicon via conductor.

8 Claims, 11 Drawing Sheets

(56) References Cited

U.S. PATENT DOCUMENTS

| | | |
|---|---|---|
| 6,190,936 B1 | 2/2001 | Moore |
| 6,194,783 B1 | 2/2001 | Raina |
| 6,274,937 B1 | 8/2001 | Ahn et al. |
| 6,300,241 B1 | 10/2001 | Moore |
| 6,309,956 B1 | 10/2001 | Chiang et al. |
| 6,348,403 B1 | 2/2002 | Raina |
| 6,348,410 B1 | 2/2002 | Ngo |
| 6,368,948 B1 | 4/2002 | Ngo |
| 6,391,777 B1 | 5/2002 | Chen et al. |
| 6,407,002 B1 | 6/2002 | Lin et al. |
| 6,413,863 B1 | 7/2002 | Liu |
| 6,440,640 B1 | 8/2002 | Yang et al. |
| 6,455,422 B1 | 9/2002 | Ngo |
| 6,455,939 B1 | 9/2002 | Raina |
| 6,468,844 B1 | 10/2002 | Yamazaki |
| 6,482,755 B1 | 11/2002 | Ngo |
| 6,483,147 B1 | 11/2002 | Lin |
| 6,500,754 B1 | 12/2002 | Erb |
| 6,503,825 B1 | 1/2003 | Iida |
| 6,506,677 B1 | 1/2003 | Avanzino |
| 6,518,183 B1 | 2/2003 | Chang et al. |
| 6,525,419 B1 | 2/2003 | Deeter et al. |
| 6,537,843 B2 | 3/2003 | Lyu |
| 6,551,857 B2 | 4/2003 | Leedy |
| 6,627,985 B2 | 9/2003 | Huppenthal et al. |
| 6,778,275 B2 | 8/2004 | Bowes |
| 6,800,930 B2 | 10/2004 | Jackson et al. |
| 6,812,193 B2 | 11/2004 | Estes et al. |
| 6,831,013 B2 | 12/2004 | Tsai et al. |
| 6,897,148 B2 | 5/2005 | Halahan et al. |
| 6,924,551 B2 | 8/2005 | Rumer et al. |
| 6,930,048 B1 | 8/2005 | Li et al. |
| 7,034,401 B2 | 4/2006 | Savastiouk et al. |
| 7,052,937 B2 | 5/2006 | Clevenger et al. |
| 7,075,133 B1 | 7/2006 | Padmanabhan et al. |
| 7,098,070 B2 | 8/2006 | Chen et al. |
| 7,111,149 B2 | 9/2006 | Eilert |
| 7,166,913 B2 | 1/2007 | Chinthakindi et al. |
| 7,222,420 B2 | 5/2007 | Moriizumi |
| 7,282,951 B2 | 10/2007 | Huppenthal et al. |
| 7,323,785 B2 | 1/2008 | Uehiyama |
| 7,338,896 B2 | 3/2008 | Vanhaelemeetsch et al. |
| 7,402,515 B2 | 7/2008 | Arana et al. |
| 7,432,592 B2 | 10/2008 | Shi et al. |
| 7,531,415 B2 | 5/2009 | Kwok |
| 7,564,115 B2 | 7/2009 | Chen et al. |
| 7,732,926 B2 | 6/2010 | Uehiyama |
| 8,076,234 B1 * | 12/2011 | Park et al. ............ 438/622 |
| 2001/0038972 A1 | 11/2001 | Lyons et al. |
| 2004/0080041 A1 | 4/2004 | Kimura |
| 2004/0188817 A1 | 9/2004 | Hua et al. |
| 2005/0136635 A1 | 6/2005 | Savastiouk et al. |
| 2005/0205991 A1 | 9/2005 | Chen et al. |
| 2006/0035146 A1 | 2/2006 | Hayashi |
| 2006/0042834 A1 | 3/2006 | Lee et al. |
| 2007/0117348 A1 | 5/2007 | Ramanathan et al. |
| 2007/0126085 A1 | 6/2007 | Kawano et al. |
| 2007/0190692 A1 | 8/2007 | Erturk et al. |
| 2008/0073747 A1 | 3/2008 | Chao et al. |
| 2008/0108193 A1 | 5/2008 | You et al. |
| 2009/0134498 A1 | 5/2009 | Ikeda et al. |
| 2009/0180257 A1 | 7/2009 | Park et al. |
| 2009/0224405 A1 | 9/2009 | Chiou |
| 2010/0001379 A1 | 1/2010 | Lee et al. |
| 2010/0140749 A1 | 6/2010 | Kuo |
| 2010/0140772 A1 | 6/2010 | Lin et al. |
| 2010/0261318 A1 * | 10/2010 | Feng et al. ............ 438/132 |
| 2010/0323478 A1 | 12/2010 | Kuo |
| 2012/0267788 A1 * | 10/2012 | Hong et al. ............ 257/774 |

* cited by examiner

THROUGH-SILICON VIA FORMING METHOD

FIELD OF THE INVENTION

The present invention relates to a through-silicon via forming method, and more particularly to a through-silicon via forming method by adjusting the level of the topside of a through-silicon via conductor relative to the surface of a semiconductor substrate.

BACKGROUND OF THE INVENTION

For saving the layout space or increasing the interconnection efficacy, at least two integrated circuits (ICs) may be stacked as a single IC package. That is, a three-dimensional (3D) stack packaging technology is used to package the integrated circuits. For implementing the 3D stack packaging technology, through-silicon vias (TSVs) are widely used. The through-silicon via is a vertical electrical connection technology via completely passing through a silicon wafer or die. Nowadays, a 3D integrated circuit (3D IC) is mainly applied to many fields such as memory stacks, image sensors or the like.

For implementing a TSV interconnect technology, a trench is firstly created in a wafer by an etching process or a laser-drilling process, and then a conductive material (e.g. copper, polysilicon, tungsten, or the like) is filled into the trench to form an interconnect between two stacked chips. The wafer is thinned, and then stacked and bonded with another wafer. Since the through-silicon via permits vertical electrical connection between stacked wafers, the use of the through-silicon via can largely minimize the size of the chip package, enhance the chip and reduce the chip power loss.

Depending on the point in the semiconductor process flow, the TSV forming method may be classified into three types, i.e. a via-first through-silicon via (via-first TSV) method, a via-middle through-silicon via (via-mid TSV) method and a via-last through-silicon via (via-last TSV) method. The TSV formed at front-end-of-line (FEOL) stage is referred as the via-first TSV. The TSV formed at back-end-of-line (BEOL) stage is referred as the via-mid TSV. The TSV formed by the via-last method is referred as the via-last TSV.

The via-first TSV is formed in the blank wafer prior to any CMOS process by a deep reactive-ion etching (DRIE) process. Since the subsequent CMOS manufacturing steps have to withstand thermal processes, usually at higher than 1000° C., the mostly used filling material is polysilicon. Moreover, the conductive material filled in the via-mid TSV is copper (Cu) or tungsten (W). Whereas, the via-last TSV is formed in a predetermined blank region of the wafer after the CMOS device is produced.

For forming the via-first TSV or the via-mid TSV, since the whole CMOS process is not completed, high temperature treating and annealing processes should be done after the step of drilling the via and the step of filling the conductive material. Due to these processes, the conductive material filled in the via-first TSV or the via-mid TSV will be thermally expanded.

For example, a copper layer is used as a filling material of the via-mid TSV. Even if the copper layer is evenly filled in the via, the subsequent high temperature treating and annealing processes may result in extrusion or degradation of the electroplated copper because the large thermal expansion coefficient difference between the copper and the silicon may cause thermo-mechanical stress. The structure of the wafer is adversely affected by the thermo-mechanical stress.

FIG. 1A schematically illustrates a through-silicon via forming method according to the prior art. For example, the substrate 10 is a silicon substrate with a contact etch stop layer (CESL) and an interlayer dielectric layer (ILD) (not shown). A dielectric layer 11, a seed layer 13 and a through-silicon via conductor 12 and are sequentially formed within a trench of the substrate 10. The through-silicon via conductor 12 is made of a conductive material (e.g. copper). The seed layer 13 is arranged between the through-silicon via conductor 12 and the dielectric layer 11 for providing good crystal growth orientation of film coating. The use of the dielectric layer 11 may facilitate isolating copper from silicon and prevent diffusion of copper into silicon.

Please refer to FIG. 1A again. After a chemical mechanical polishing (CMP) process is performed, the surfaces of the dielectric layer 11 and the through-silicon via conductor 12 are flattened, so that the surface of the through-silicon via conductor 12 is at the same level as the surface of the substrate 10. Consequently, the through-silicon via conductor 12 can be used in the subsequent wiring process.

However, during the subsequent process of forming a dielectric isolation layer 16 and a metal layer 15, the high temperature treating process may result in extrusion of the through-silicon via conductor 12. Due to the extrusion of the through-silicon via conductor 12, as shown in FIG. 1B, the through-silicon via conductor 12 is protruded from the surface of the substrate 10.

As described in FIGS. 1A and 1B, the conventional methods of forming the via-first TSV or the via-mid TSV have some drawbacks. For example, after the through-silicon via conductor is filled in the trench and the surface of the through-silicon via conductor is flattened to be at the same level as the surface of the substrate, the subsequent high temperature treating and annealing processes may result in extrusion of the through-silicon via conductor because of volume expansion. Due to the volume expansion of the through-silicon via conductor, the through-silicon via conductor will be protruded from the surface of the substrate to extrude the overlying semiconductor circuit. Under this circumstance, the stack structure is possibly damaged. Therefore, there is a need of providing an improved through-silicon via method.

SUMMARY OF THE INVENTION

In accordance with an aspect, the present invention provides a through-silicon via forming method. Firstly, a semiconductor substrate is provided. Then, a through-silicon via conductor is formed in the semiconductor substrate, and a topside of the through-silicon via conductor is allowed to be at the same level as a surface of the semiconductor substrate. Afterwards, a portion of the through-silicon via conductor is removed, and the topside of the through-silicon via conductor is allowed to be at a level lower than the surface of the semiconductor substrate, so that a recess is formed over the through-silicon via conductor.

In accordance with another aspect, the present invention provides a through-silicon via forming method. Firstly, a semiconductor substrate is provided. Then, a through-silicon via conductor is formed in the semiconductor substrate, and a topside of the through-silicon via conductor is allowed to be at the same level as a surface of the semiconductor substrate. Then, the semiconductor substrate having the through-silicon via conductor is thermally treated such that the topside of the through-silicon via conductor is protruded from the surface of the semiconductor substrate. Afterwards, a portion of the through-silicon via conductor, and the topside of the through-silicon via conductor is allowed to be at the same level as or slightly lower than the surface of the semiconductor substrate.

In accordance with a further aspect, the present invention provides a through-silicon via forming method. Firstly, a semiconductor substrate is provided. Then, a through-silicon via conductor is formed in the semiconductor substrate, wherein a topside of the through-silicon via conductor is slightly lower than a surface of the semiconductor substrate. Afterwards, the semiconductor substrate having the through-silicon via conductor is thermally treated such that the topside of the through-silicon via conductor is substantially at the same level as the surface of the semiconductor substrate.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

As previously described, the method of forming the via-first TSV or the via-mid TSV is distinguished from the method of forming the via-last TSV. That is, for forming the via-first TSV or the via-mid TSV, the volume of the conductive material (e.g. copper, tungsten, polysilicon or molybdenum) filled in the through-silicon via will be expanded because of the subsequent high temperature treatment (e.g. at a temperature higher than 400° C.). Due to the volume expansion of the conductive material, the conductive material is protruded from the surface of the substrate to extrude the overlying semiconductor circuit. Under this circumstance, the stack structure is possibly damaged.

Figure 1A:
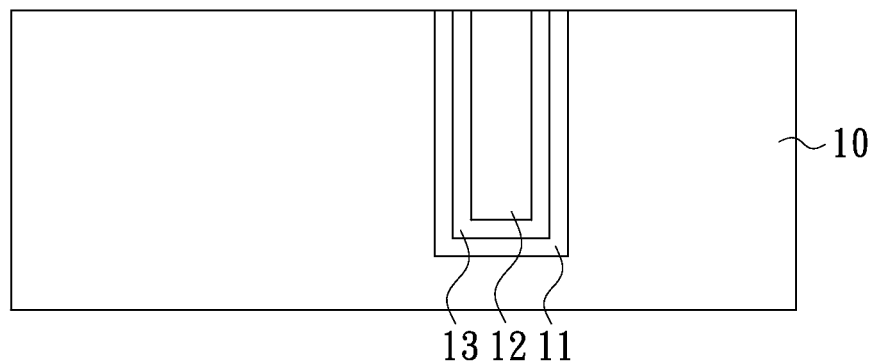
FIG. 1A schematically illustrates a through-silicon via forming method according to the prior art.
Figure 1B:
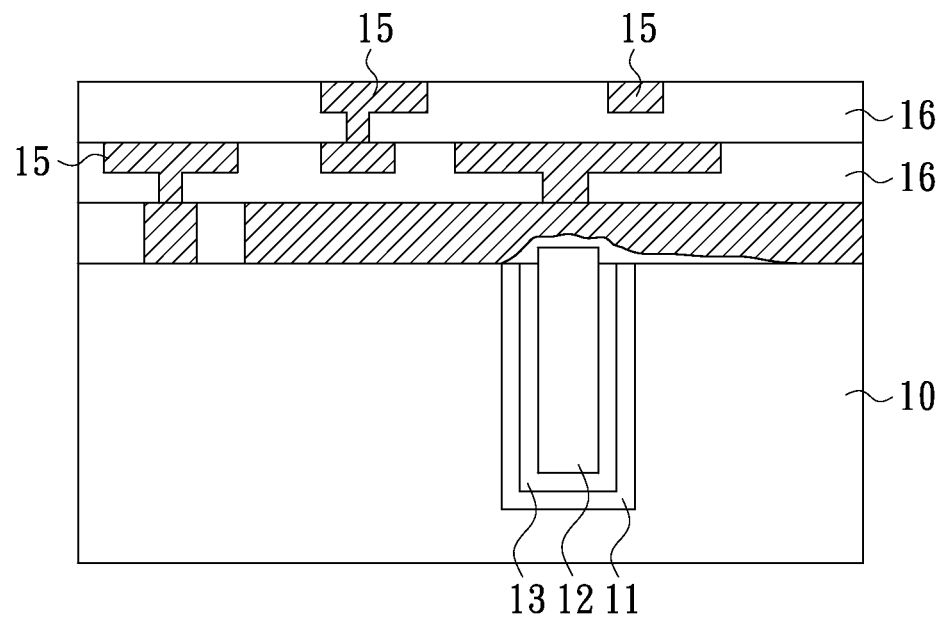
FIG. 1B schematically illustrates the formation of an extrusion of a through-silicon via conductor in the subsequent high temperature treating process.
Figure 2:
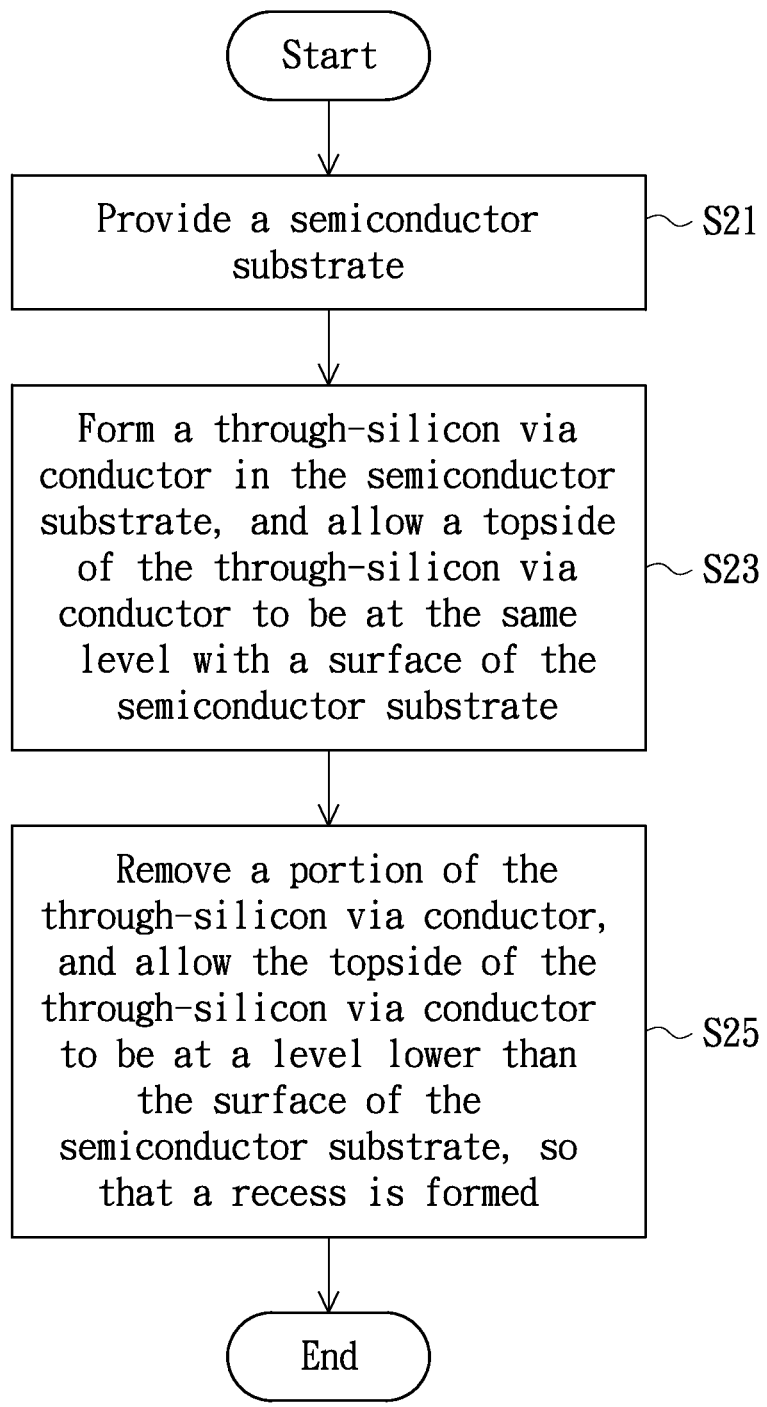
FIG. 2 schematically illustrates a flowchart of a through-silicon via forming method according to a first embodiment of the present invention.

For solving these drawbacks, the present invention provides a through-silicon via forming method for minimizing the possibility of causing the extrusion in the subsequent high temperature treating process. FIG. 2 schematically illustrates a flowchart of a through-silicon via forming method according to a first embodiment of the present invention. Firstly, in the step S21, a semiconductor substrate is provided. Then, in the step S23, a through-silicon via conductor is formed in the semiconductor substrate, so that the topside of the through-silicon via conductor is at the same level as the surface of the semiconductor substrate. Then, in the step S25, a portion of the through-silicon via conductor is removed, so that the topside of the through-silicon via conductor is at a level lower than the surface of the semiconductor substrate and a recess is formed over the through-silicon via conductor. In an embodiment, the length of the through-silicon via conductor (i.e. the depth of the trench) is about 10~100 micrometers, preferably 60~70 micrometers. In a case that the diameter of the through-silicon via conductor is about 10 micrometers, the depth of the recess is about 100~1,000 angstroms, for example 300 angstroms. In accordance with a key feature of the present invention, the depth of the recess is retained as a space of accommodating the expanded through-silicon via conductor.

Depending on the point in the semiconductor process flow, the flowchart of FIG. 2 may be implemented by a via-first through-silicon via technology or a via-middle through-silicon via technology. In a case that the flowchart is applied to the via-first through-silicon via technology, the semiconductor substrate is a silicon substrate. Whereas, in a case that the flowchart is applied to the via-middle through-silicon via technology, the semiconductor substrate is a silicon substrate with a contact etch stop layer and an interlayer dielectric layer.

After the steps listed in the flowchart of FIG. 2 are completed, some additional subsequent processes may be performed according to the practical requirements. For example, a semiconductor circuit (e.g. a memory circuit) may be formed over the semiconductor substrate. Alternatively, by removing a portion of the semiconductor substrate, the bottom side of the through-silicon via conductor is exposed to implement a system in a package (SIP) technology, thereby minimizing the area of the semiconductor circuit.

FIGS. 3A~3G are schematic cross-sectional views illustrating some steps of a through-silicon via forming method implemented by a via-first through-silicon via technology according to the first embodiment of the present invention.

Figure 3A:
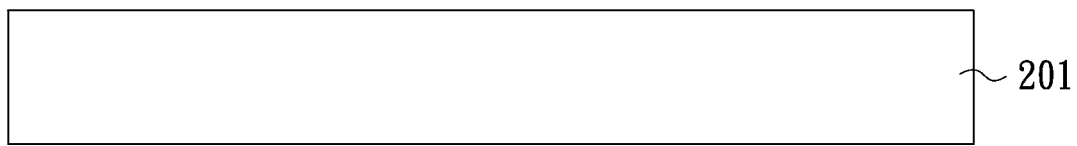
FIGS. 3A~3G are schematic cross-sectional views illustrating some steps of a through-silicon via forming method implemented by a via-first through-silicon via technology according to the first embodiment of the present invention.
Figure 3B:
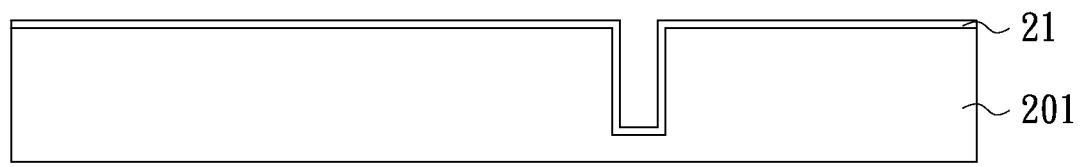
Figure 3C:
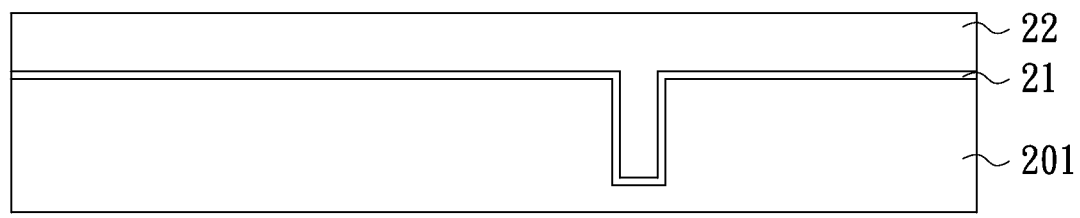
Figure 3D:
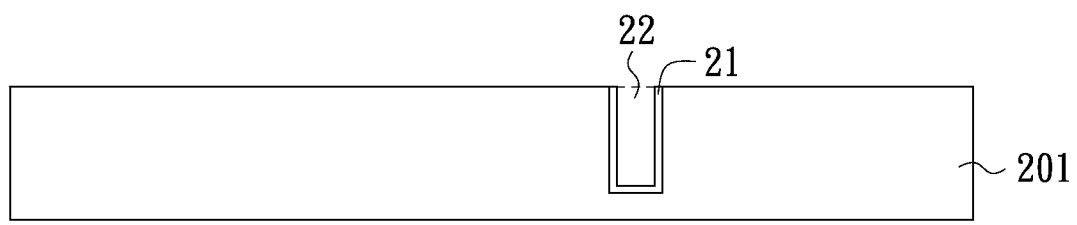

As shown in FIG. 3A, a silicon substrate 201 is provided (see also the step S21 of FIG. 2). The step S23 of FIG. 2 comprises some sub-steps as shown in FIGS. 3B, 3C and 3D. As shown in FIG. 3B, a trench is formed in the silicon substrate 201, and a dielectric layer 21 is formed on the inner surface of the trench and the surface of the silicon substrate 201. As shown in FIG. 3C, a copper layer 22 is formed on the dielectric layer 21 and filled in the trench. Then, by an etching process or a chemical mechanical polishing process, the copper layer 22 and the dielectric layer 21 overlying the surface of the silicon substrate 201 are removed. Consequently, as shown in FIG. 3D, the topside of the copper layer 22 is at the same level as the surface of the silicon substrate 201. Meanwhile, the copper layer 22 may be also referred as a through-silicon via conductor.

Figure 3E:
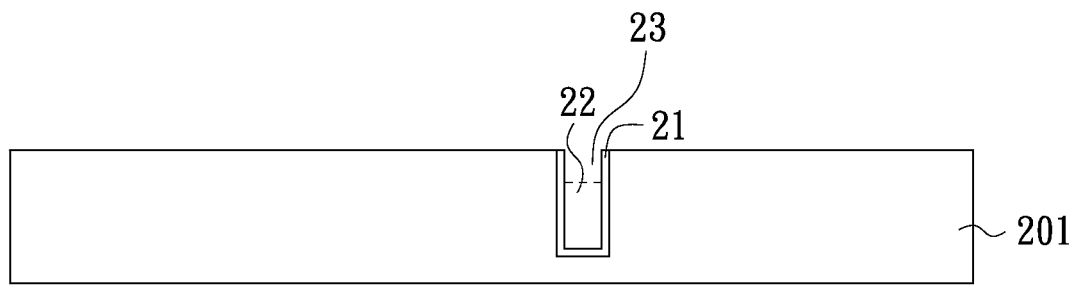

Then, as shown in FIG. 3E, a portion of the through-silicon via conductor 22 is removed (see also the step S25 of FIG. 2). Under this circumstance, the topside of the through-silicon via conductor 22 is at a level lower than the surface of the silicon substrate 201, so that a recess 23 is formed over the through-silicon via conductor 22.

Figure 3F:
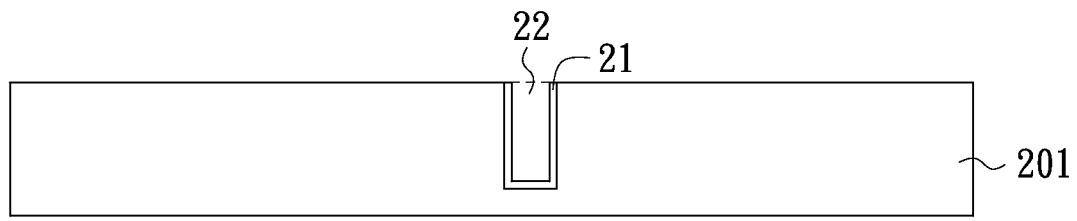

Then, as shown in FIG. 3F, subsequent high temperature treating and annealing processes result in extrusion of the copper layer 22. Since the topside of the through-silicon via conductor 22 is adjusted to be lower than the surface of the silicon substrate 201 prior to the high temperature treating and annealing processes, the extrusion of the copper layer 22 is substantially at the same level as or slightly lower than the surface of the silicon substrate 20. Under this circumstance, the possibility of extruding the top stack will be minimized.

Figure 3G:
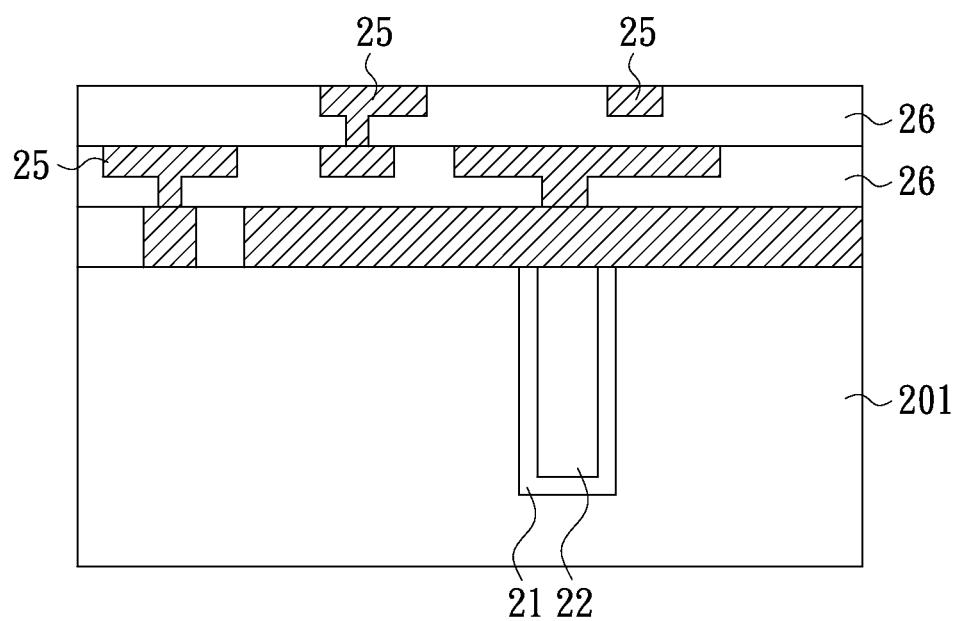

FIG. 3G is a schematic cross-sectional view illustrating a semiconductor circuit formed over the silicon substrate. As shown in FIG. 3G, even if an extrusion is produced during the subsequent post-thermal treatment process of forming a dielectric isolation layer 26 and a metal layer 25, since the expanded through-silicon via conductor 22 is not protruded over the surface of the silicon substrate 20, the possibility of extruding the top stack will be minimized.

FIGS. 4A~4F are schematic cross-sectional views illustrating some steps of a through-silicon via forming method implemented by a via-middle through-silicon via technology according to the first embodiment of the present invention.

Figure 4A:
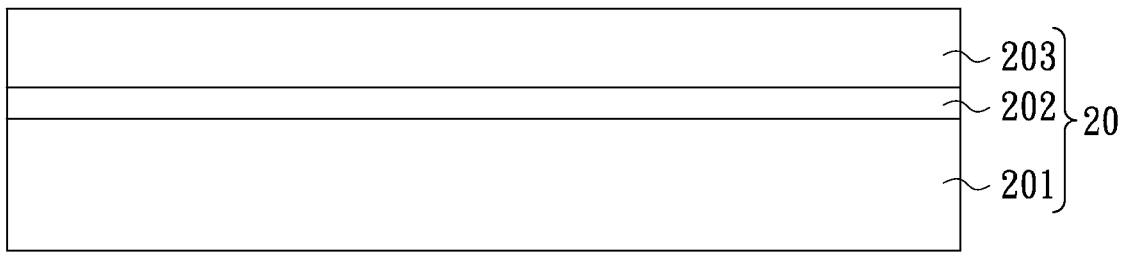
FIGS. 4A~4F are schematic cross-sectional views illustrating some steps of a through-silicon via forming method implemented by a via-middle through-silicon via technology according to the first embodiment of the present invention.
Figure 4B:
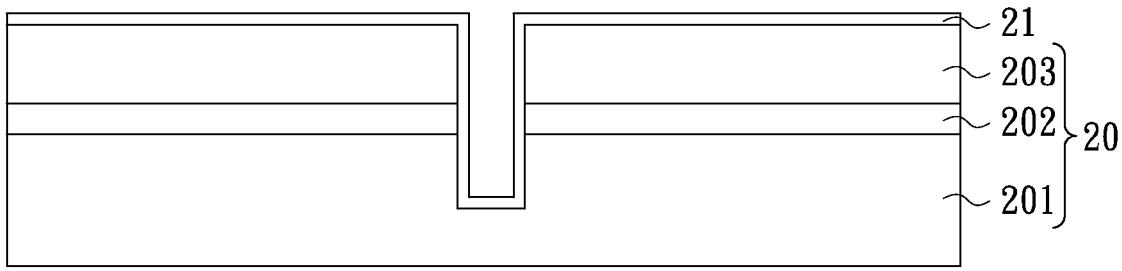
Figure 4C:
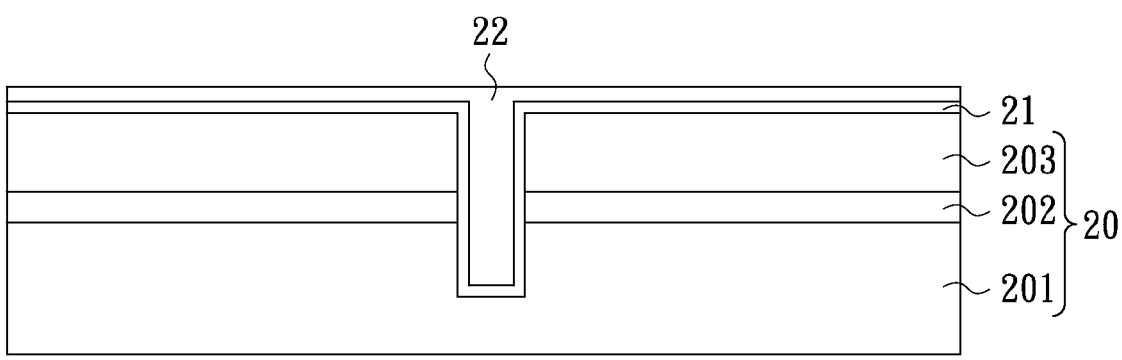
Figure 4D:
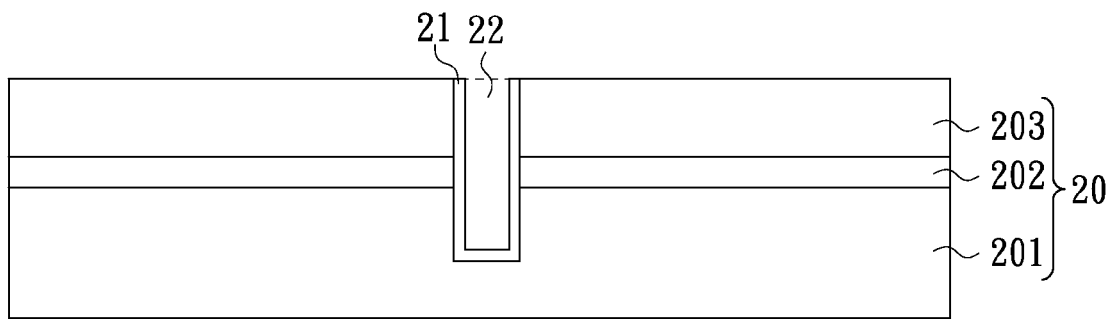

As shown in FIG. 4A, a semiconductor substrate 20 including a silicon substrate 201 with a contact etch stop layer 202 and an interlayer dielectric layer 203 is provided (see also the step S21 of FIG. 2). The step S23 of FIG. 2 comprises some sub-steps as shown in FIGS. 4B, 4C and 4D. As shown in FIG. 4B, a trench is formed in the semiconductor substrate 20, and a dielectric layer 21 is formed on the inner surface of the trench and the surface of the interlayer dielectric layer 203. As shown in FIG. 3C, a copper layer 22 is formed on the dielectric layer 21 and filled in the trench. Then, by an etching process or a chemical mechanical polishing process, the copper layer 22 and the dielectric layer 21 overlying the surface of the semiconductor substrate 20 are removed. Consequently, as shown in FIG. 4D, the topside of the copper layer 22 is at the same level as the surface of the interlayer dielectric layer 203. Meanwhile, the copper layer 22 may be also referred as a through-silicon via conductor.

Figure 4E:
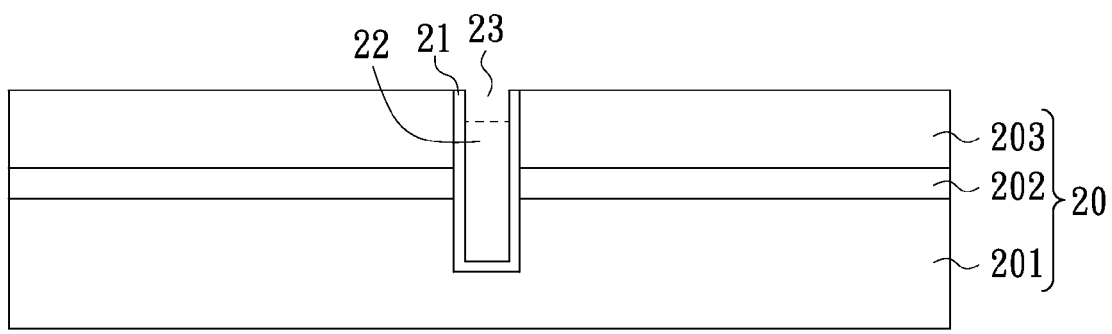

Then, as shown in FIG. 4E, a portion of the through-silicon via conductor 22 is removed (see also the step S25 of FIG. 2). Under this circumstance, the topside of the through-silicon via conductor 22 is at a level lower than the surface of the interlayer dielectric layer 203, so that a recess 23 is formed over the through-silicon via conductor 22.

Figure 4F:
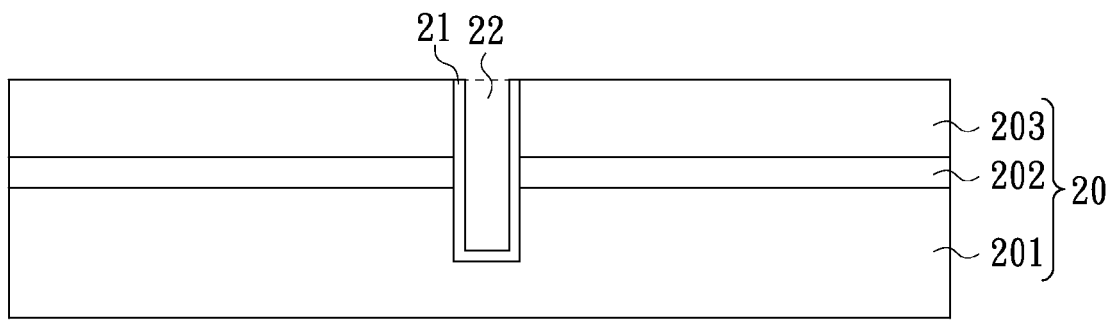

Then, as shown in FIG. 4F, subsequent high temperature treating and annealing processes result in extrusion of the copper layer 22. Since the topside of the through-silicon via conductor 22 is adjusted to be lower than the surface of the silicon substrate 201 prior to the high temperature treating and annealing processes, the extrusion of the copper layer 22 is substantially at the same level as or slightly lower than the surface of the interlayer dielectric layer 203. Under this circumstance, the possibility of extruding the top stack will be minimized.

Figure 5:
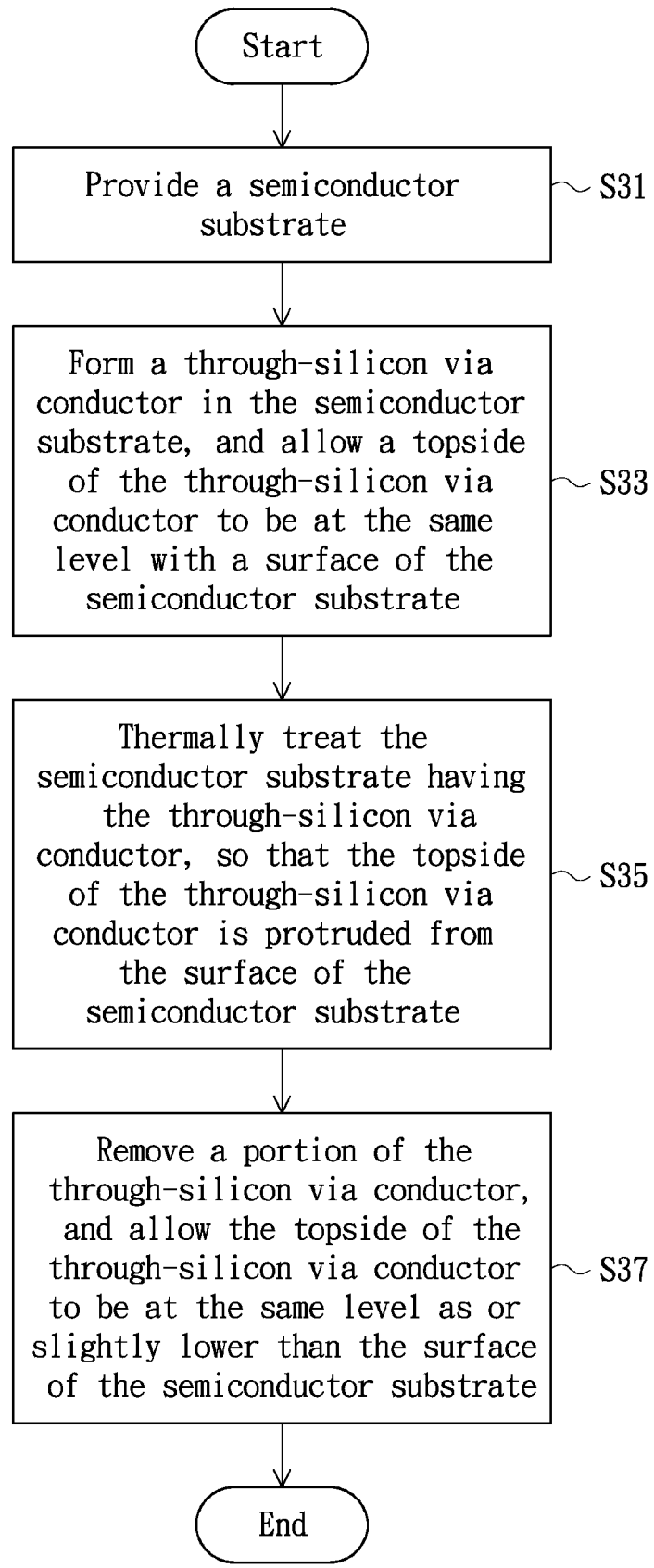
FIG. 5 schematically illustrates a flowchart of a through-silicon via forming method according to a second embodiment of the present invention.

FIG. 5 schematically illustrates a flowchart of a through-silicon via forming method according to a second embodiment of the present invention. Depending on the point in the semiconductor process flow, the flowchart of FIG. 5 may be implemented by a via-first through-silicon via technology or a via-middle through-silicon via technology. In a case that the flowchart is applied to the via-first through-silicon via technology, the semiconductor substrate is a silicon substrate. Whereas, in a case that the flowchart is applied to the via-middle through-silicon via technology, the semiconductor substrate is a silicon substrate with a contact etch stop layer and an interlayer dielectric layer.

Firstly, in the step 31, a semiconductor substrate is provided. Then, in the step 33, a through-silicon via conductor is formed in the semiconductor substrate, so that the topside of the through-silicon via conductor is at the same level as the surface of the semiconductor substrate. Then, in the step S35, the semiconductor substrate having the through-silicon via conductor is thermally treated, so that the topside of the through-silicon via conductor is protruded from the surface of the semiconductor substrate. Then, in the step S37, a portion of the through-silicon via conductor is removed, so that the topside of the through-silicon via conductor is at the same level as or slightly lower than the surface of the semiconductor substrate again.

After the steps listed in the flowchart of FIG. 5 are completed, some additional subsequent processes may be performed according to the practical requirements. For example, a semiconductor circuit (e.g. a memory) may be formed over the semiconductor substrate. Alternatively, by removing a portion of the semiconductor substrate, the bottom side of the through-silicon via conductor is exposed to implement a system in a package (SIP) technology, thereby minimizing the area of the semiconductor circuit.

Figure 6A:
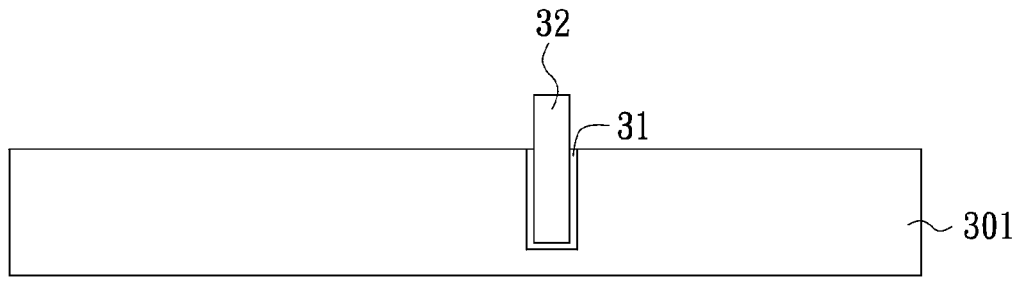
FIGS. 6A~6B are schematic cross-sectional views illustrating some steps of a through-silicon via forming method implemented by a via-first through-silicon via technology according to the second embodiment of the present invention.
Figure 6B:
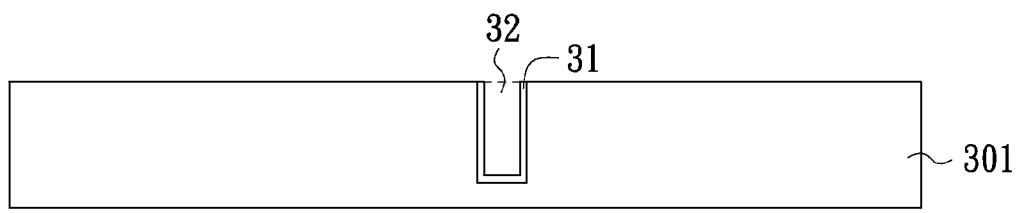

FIGS. 6A~6B are schematic cross-sectional views illustrating some steps of a through-silicon via forming method implemented by a via-first through-silicon via technology according to the second embodiment of the present invention.

Firstly, the steps S31 and S33 are performed. The steps S31 and S33 are similar to the steps S21 and S23 as shown in FIG. 2, and are not redundantly described herein.

Then, as shown in FIG. 6A, the silicon substrate 301 having the through-silicon via conductor is thermally treated at a high operating temperature from 400° C. to 500° C. for a time period from 10 minutes to 2 hours. Consequently, the topside of the through-silicon via conductor is thermally expanded and protruded from the surface of the silicon substrate 301 (see also the step S35 of FIG. 5). In this step, the through-silicon via conductor is thermally treated at a relatively higher operating temperature, so that the topside of the through-silicon via conductor 32 is protruded from the surface of the silicon substrate 301.

Then, as shown in FIG. 6B, a portion of the through-silicon via conductor is removed by an etch-back process or a mechanical polishing process, so that the topside of the through-silicon via conductor is at the same level as or slightly lower than the surface of the silicon substrate 301 (see also the step S37 of FIG. 5). Since the subsequent high temperature treating process is carried out at a temperature lower than the operating temperature of step S35, the subsequent high temperature treating process will no longer result in obvious extrusion of the through-silicon via conductor 32. In other words, since the through-silicon via conductor 32 is not higher than the surface of the silicon substrate 301, the possibility of extruding the top stack will be minimized.

Figure 7A:
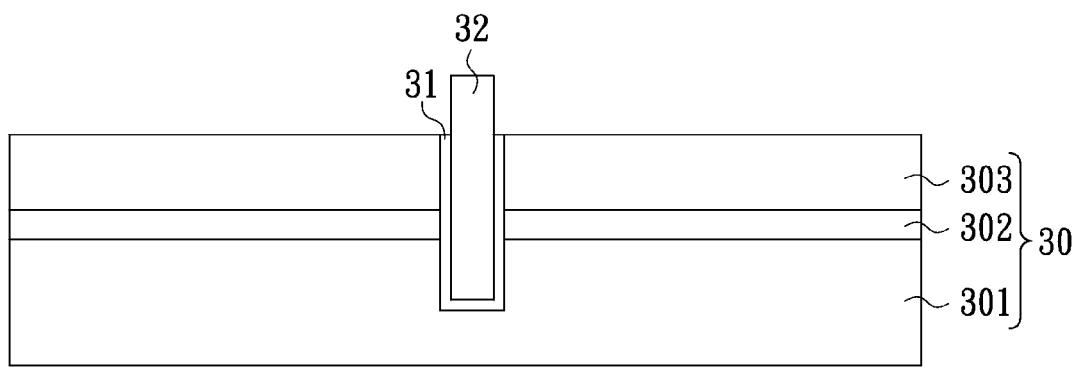
FIGS. 7A~7B are schematic cross-sectional views illustrating some steps of a through-silicon via forming method implemented by a via-middle through-silicon via technology according to the second embodiment of the present invention.
Figure 7B:
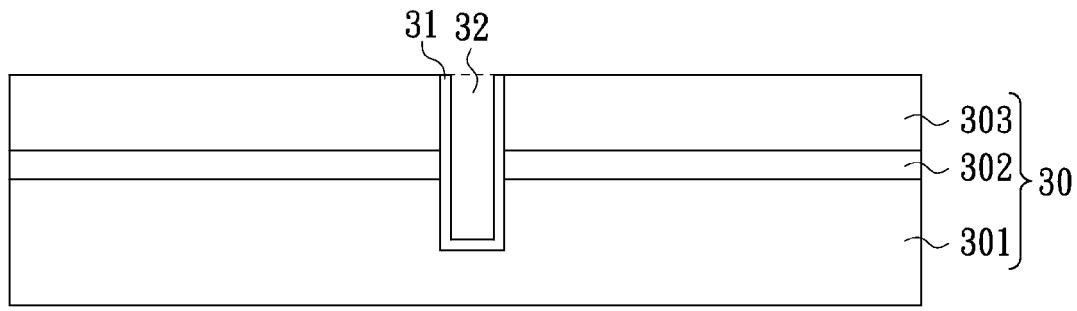

FIGS. 7A~7B are schematic cross-sectional views illustrating some steps of a through-silicon via forming method implemented by a via-middle through-silicon via technology according to the second embodiment of the present invention.

Firstly, the steps S31 and S33 are performed. The steps S31 and S33 are similar to the steps S21 and S23 as shown in FIG. 2, and are not redundantly described herein. In this embodiment, the semiconductor substrate 30 is a silicon substrate 301 with a contact etch stop layer 302 and an interlayer dielectric layer 303. After a copper layer 32 is formed on the dielectric layer 31 and filled in the trench, the copper layer 32 and the dielectric layer 31 overlying the surface of the semiconductor substrate 30 are removed by an etching process or a chemical mechanical polishing process. Consequently, the resulting structure as shown in FIG. 4D is provided.

Then, as shown in FIG. 7A, the semiconductor substrate having the through-silicon via conductor is thermally treated at a high operating temperature. Due to the high operating temperature, the through-silicon via conductor 32 is thermally expanded, and the topside of the through-silicon via conductor is protruded from the surface of the interlayer dielectric layer 303 (see also the step S35 of FIG. 5).

Then, as shown in FIG. 7B, a portion of the through-silicon via conductor 32 is removed by an etching process or a mechanical polishing process, so that the topside of the through-silicon via conductor 32 is at the same level as or slightly lower than the surface of the interlayer dielectric layer 303 (see also the step S37 of FIG. 5). Since the subsequent high temperature treating process is carried out at a temperature lower than the operating temperature of step S35, the subsequent high temperature treating process will no longer result in obvious extrusion of the through-silicon via conductor 32. In other words, since the through-silicon via conductor 32 is not higher than the surface of the interlayer dielectric layer 303, the possibility of extruding the top stack will be minimized.

Figure 8:
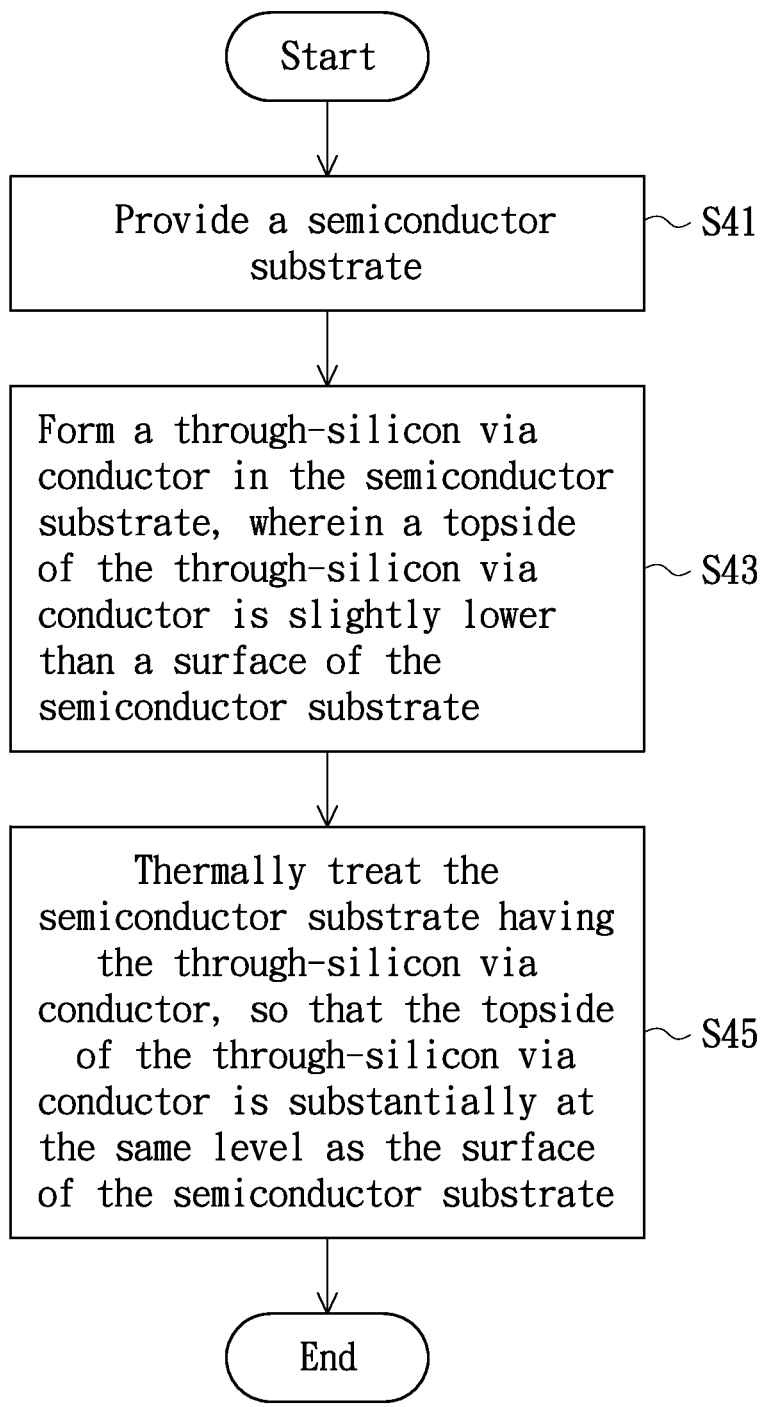
FIG. 8 schematically illustrates a flowchart of a through-silicon via forming method according to a third embodiment of the present invention.

FIG. 8 schematically illustrates a flowchart of a through-silicon via forming method according to a third embodiment of the present invention. Firstly, in the step S41, a semiconductor substrate is provided. Then, in the step 43, a through-silicon via conductor is formed in the semiconductor substrate, wherein the topside of the through-silicon via conductor is at a level slightly lower than the surface of the semiconductor substrate. Then, in the step S45, the semiconductor substrate having the through-silicon via conductor is thermally treated, so that the topside of the through-silicon via conductor is substantially at the same level as the surface of the semiconductor substrate.

Depending on the point in the semiconductor process flow, the flowchart of FIG. 8 may be implemented by a via-first through-silicon via technology or a via-middle through-silicon via technology. In a case that the flowchart is applied to the via-first through-silicon via technology, the semiconductor substrate is a silicon substrate 401. Whereas, in a case that the flowchart is applied to the via-middle through-silicon via technology, the semiconductor substrate is a silicon substrate 401 with a contact etch stop layer 402 and an interlayer dielectric layer 403.

Figure 9A:
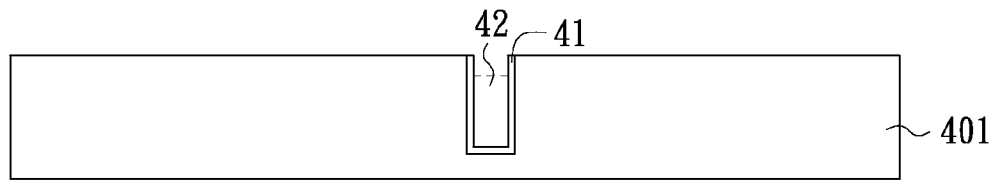
FIGS. 9A~9B are schematic cross-sectional views illustrating some steps of a through-silicon via forming method implemented by a via-first through-silicon via technology according to the third embodiment of the present invention.
Figure 9B:
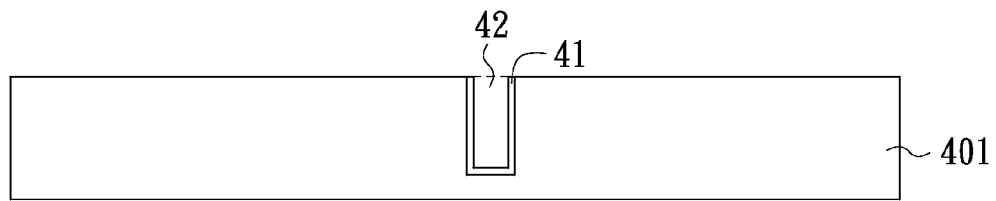

FIGS. 9A~9B are schematic cross-sectional views illustrating some steps of a through-silicon via forming method implemented by a via-first through-silicon via technology according to the third embodiment of the present invention.

Firstly, the steps S41 and S43 are performed. The steps S41 is similar to the step S21 as shown in FIG. 2, the step S43 is similar to the steps S23 and S25, and are not redundantly described herein. Meanwhile, the copper layer 42 is formed on the dielectric layer 41 and filled in the trench.

Then, as shown in FIG. 9A, by an etching process, the copper layer 42 and the dielectric layer 41 overlying the surface of the silicon substrate 401 are removed, and the topside of the copper layer 42 is slightly lower than the surface of the silicon substrate 401 (see also the step S43 and FIG. 8). The copper layer 42 may be also referred as a through-silicon via conductor.

Then, as shown in FIG. 9B, the silicon substrate 401 having the through-silicon via conductor is thermally treated at a high operating temperature from 400° C. to 500° C. for a time period from 10 minutes to 2 hours. Since the through-silicon via conductor is thermally expanded, the topside of the through-silicon via conductor is substantially at the same level as the surface of the silicon substrate 401.

Since the subsequent high temperature treating process is carried out at a temperature lower than the operating temperature of step S45, the subsequent high temperature treating process will no longer result in obvious extrusion of the through-silicon via conductor 42. In other words, since the through-silicon via conductor 42 is still not higher than the surface of the silicon substrate 401, the possibility of extruding the top stack will be minimized.

Figure 10A:
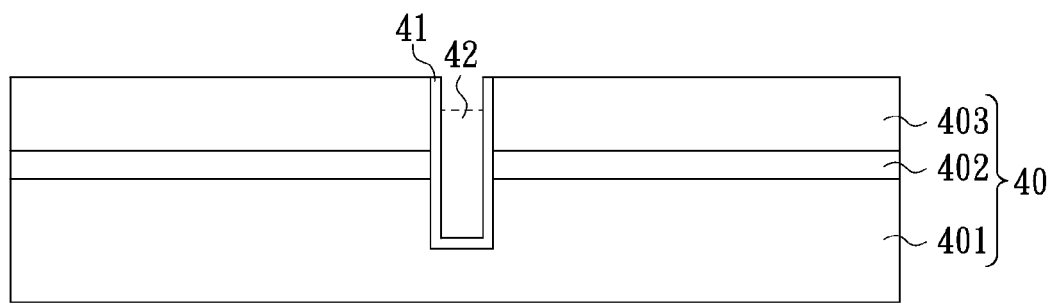
FIGS. 10A~10B are schematic cross-sectional views illustrating some steps of a through-silicon via forming method implemented by a via-middle through-silicon via technology according to the third embodiment of the present invention.
Figure 10B:
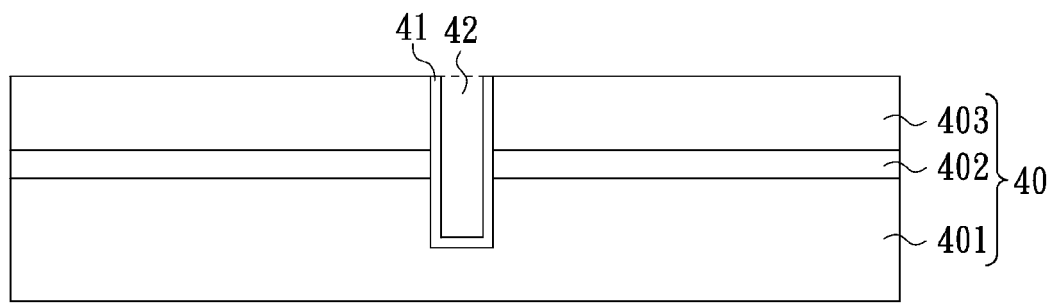

FIGS. 10A~10B are schematic cross-sectional views illustrating some steps of a through-silicon via forming method implemented by a via-middle through-silicon via technology according to the third embodiment of the present invention.

Firstly, the steps S41 and S43 are performed. The steps S41 is similar to the step S21 as shown in FIG. 2, the step S43 is similar to the steps S23 and S25, and are not redundantly described herein. In this embodiment, the semiconductor substrate 40 is a silicon substrate 401 with a contact etch stop layer 402 and an interlayer dielectric layer 403. Meanwhile, the copper layer 42 is formed on the dielectric layer 41 and filled in the trench.

Then, as shown in FIG. 10A, by an etching process, the copper layer 42 and the dielectric layer 41 overlying the surface of the silicon substrate 401 are removed, and the topside of the copper layer 42 is slightly lower than the surface of the interlayer dielectric layer 403 (see also the step S43 and FIG. 8). The copper layer 42 may be also referred as a through-silicon via conductor.

Then, as shown in FIG. 10B, the semiconductor substrate 40 having the through-silicon via conductor is thermally treated. Since the through-silicon via conductor is thermally expanded, the topside of the through-silicon via conductor is substantially at the same level as the surface of the interlayer dielectric layer 403.

Since the subsequent high temperature treating process is carried out at a temperature lower than the operating temperature of step S45, the subsequent high temperature treating process will no longer result in obvious extrusion of the through-silicon via conductor 42. In other words, since the through-silicon via conductor 42 is still not higher than the surface of the interlayer dielectric layer 403, the possibility of extruding the top stack will be minimized.

From the above description, the present invention provides three embodiments of the through-silicon via forming method in order to minimize the possibility of extruding the top stack through thermal expansion. Depending on the point in the semiconductor process flow, the through-silicon via forming method may be implemented by a via-first through-silicon via technology or a via-middle through-silicon via technology. In the first embodiment, a recess is retained as a space of accommodating the expanded through-silicon via conductor. In the second embodiment, the through-silicon via conductor is thermally treated at a high operating temperature and then the portion of the through-silicon via conductor higher than the surface of the semiconductor substrate is removed, so that subsequent high temperature treating process will no longer result in obvious extrusion of the through-silicon via conductor. In the third embodiment, a through-silicon via conductor lower than the surface of the semiconductor substrate is firstly formed, then the through-silicon via conductor is thermally treated at a high operating temperature, so that the topside of the through-silicon via conductor is substantially at the same level as the surface of the semiconductor substrate. By the through-silicon via forming method of the present invention, the semiconductor circuit can be suitably mounted on the semiconductor substrate.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A through-silicon via forming method, comprising steps of:
   providing a semiconductor substrate;
   forming a through-silicon via conductor in the semiconductor substrate, and allowing a topside of the through-silicon via conductor to be at the same level as a surface of the semiconductor substrate; and
   removing a portion of the through-silicon via conductor, and allowing the topside of the through-silicon via conductor to be at a level lower than the surface of the semiconductor substrate, so that a recess is formed over the through-silicon via conductor, wherein a depth of the recess is retained as a space of accommodating an expanded portion of the through-silicon via conductor;
   wherein the method is implemented by a via-first through-silicon via technology only or a via-middle through-silicon via technology only.

2. The through-silicon via forming method according to claim 1, wherein the step of allowing the topside of the through-silicon via conductor to be at the same level as the surface of the semiconductor substrate is performed by a chemical mechanical polishing process or an etching process.

3. The through-silicon via forming method according to claim 1, wherein the step of removing the portion of the through-silicon via conductor is performed by an etching process.

4. The through-silicon via forming method according to claim 1, wherein the through-silicon via conductor is made of copper, tungsten, polysilicon or molybdenum.

5. The through-silicon via forming method according to claim 1, further comprising a step of forming a semiconductor circuit element over the semiconductor substrate.

6. The through-silicon via forming method according to claim 1, further comprising a step of partially removing the semiconductor substrate to expose a bottom side of the through-silicon via conductor.

7. A through-silicon via forming method, comprising steps of:
   providing a semiconductor substrate;
   forming a through-silicon via conductor in the semiconductor substrate, and allowing a topside of the through-silicon via conductor to be slightly lower than a surface of the semiconductor substrate; and
   thermally treating the semiconductor substrate having the through-silicon via conductor such that the topside of the through-silicon via conductor is substantially expanded to the same level as the surface of the semiconductor substrate;
   wherein the method is implemented by a via-first through-silicon via technology only or a via-middle through-silicon via technology only.

8. The through-silicon via forming method according to claim 7, wherein the through-silicon via conductor is made of copper, tungsten, polysilicon or molybdenum.

* * * * *